(12) United States Patent
Lysacek et al.

(10) Patent No.: US 10,242,929 B1
(45) Date of Patent: Mar. 26, 2019

(54) METHOD OF FORMING A MULTILAYER STRUCTURE FOR REDUCING DEFECTS IN SEMICONDUCTOR DEVICES AND STRUCTURE

(71) Applicant: SEMICONDUCTOR COMPONENTS INDUSTRIES, LLC, Phoenix, AZ (US)

(72) Inventors: David Lysacek, Zasova (CZ); Viola Krizakova, Studenka (CZ); Jan Sik, Čeladná (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/827,882

(22) Filed: Nov. 30, 2017

(51) Int. Cl.
*H01L 23/31* (2006.01)
*H01L 21/56* (2006.01)
(Continued)

(52) U.S. Cl.
CPC ...... *H01L 23/3192* (2013.01); *H01L 21/3221* (2013.01); *H01L 21/56* (2013.01); *H01L 23/26* (2013.01); *H01L 23/291* (2013.01); *H01L 23/298* (2013.01); *H01L 23/562* (2013.01); *H01L 29/735* (2013.01)

(58) Field of Classification Search
None
See application file for complete search history.

(56) References Cited

U.S. PATENT DOCUMENTS

| 4,053,335 A | 10/1977 | Hu | |
| 5,753,134 A * | 5/1998 | Biebl | B81C 1/00666 216/96 |

(Continued)

OTHER PUBLICATIONS

D. Lysacek, J. Sik, P. Babor: Polycrystalline silicon layers with enhanced thermal stability, Solid State Phenomena vols. 178-179 (2011) pp. 385-391 Trans Tech Publications, Switzerland.

(Continued)

*Primary Examiner* — Andres Munoz
(74) *Attorney, Agent, or Firm* — Kevin B. Jackson

(57) ABSTRACT

A method of forming a semiconductor device includes providing a semiconductor substrate and forming amorphous semiconductor layers adjacent a major surface of the substrate. The method includes interposing dielectric layers between the amorphous semiconductor layers. The method includes forming polycrystalline semiconductor layers adjacent the amorphous semiconductor layers. The method includes interposing dielectric layers between the polycrystalline semiconductor layers and between the last amorphous semiconductor layer and the first polycrystalline semiconductor layer. The method includes forming a fine-grain polycrystalline semiconductor layer adjacent the polycrystalline semiconductor layers but is separated from the last polycrystalline semiconductor layer by an additional dielectric layer. The fine-grain polycrystalline semiconductor layer is formed at a higher temperature than the polycrystalline semiconductor layers and the amorphous semiconductor layers. A semiconductor device can be formed in another major surface of the semiconductor substrate.

20 Claims, 7 Drawing Sheets

(51) Int. Cl.
   *H01L 23/29*    (2006.01)
   *H01L 23/26*    (2006.01)
   *H01L 23/00*    (2006.01)
   *H01L 21/322*   (2006.01)
   *H01L 29/735*   (2006.01)

(56) References Cited

U.S. PATENT DOCUMENTS

| | | | | |
|---|---|---|---|---|
| 6,046,095 | A * | 4/2000 | Horikawa | H01L 21/3221 257/E21.318 |
| 6,268,068 | B1 * | 7/2001 | Heuer | C23C 16/24 257/E21.101 |
| 6,479,166 | B1 * | 11/2002 | Heuer | C23C 16/24 257/E21.101 |
| 6,610,361 | B1 * | 8/2003 | Heuer | C23C 16/24 257/E21.101 |
| 7,737,004 | B2 | 6/2010 | Lysacek et al. | |
| 8,846,500 | B2 | 9/2014 | Lysacek et al. | |
| 2004/0241946 | A1 * | 12/2004 | Kim | H01L 21/0209 438/279 |
| 2006/0029817 | A1 | 2/2006 | Hall | |
| 2012/0146024 | A1 * | 6/2012 | Lysacek | H01L 21/3221 257/52 |

OTHER PUBLICATIONS

D. Lysacek, P. Kostelnik, P. Panek: Polycrystalline silicon gettering layers with controlled residual stress, Solid State Phenomena, vols. 205-206 (2013), pp. 284-289 Trans Tech Publications, Switzerland.

D. Lysacek L. Valek, J. Spousta, T. Sikola, R. Spetik: Thermal stability of undoped polycrystalline silicon layers on antimony and boron-doped substrates, Thin Solid Films, 518 (2010) 4052-4057 www.elsevier.com/locate/tsf.

* cited by examiner

| Level | Minimum | 10% | 25% | Median | 75% | 90% | Maximum |
|---|---|---|---|---|---|---|---|
| Present Emb. | 18.828 | 22.3388 | 24.58 | 26.265 | 27.872 | 28.9322 | 33.004 |
| Standard POLY | 37.536 | 40.5342 | 41.934 | 43.87 | 46.945 | 49.3204 | 64.955 |

METHOD OF FORMING A MULTILAYER STRUCTURE FOR REDUCING DEFECTS IN SEMICONDUCTOR DEVICES AND STRUCTURE

CROSS-REFERENCE TO RELATED APPLICATIONS

Not Applicable.

BACKGROUND

This invention relates generally to electronic devices, and more specifically to manufacturing methods and structures that improve semiconductor device performance.

In the processing of integrated circuit (IC) devices, yield is a key economical parameter that IC manufacturers pay close attention to. Poor yielding devices impact, among other things, manufacturing cycle time, resource allocation, on-time delivery, market share, and profits. Excessive or high leakage current is often one parameter that causes poor yields in IC manufacturing. High leakage current is typically caused by the presence of fast diffusing impurities or defects in active device regions within a semiconductor substrate.

One known method of reducing this problem is referred to as extrinsic gettering, which is a process to remove the unwanted impurities from critical regions of IC devices and thereby reduce the formation of impurity related defects. In a typical extrinsic gettering process, one or more polycrystalline semiconductor layers are deposited on the back or lower surface (i.e., the surface opposite the surface where active devices are formed) of a monocrystalline semiconductor wafer prior to any high temperature process. The presence of the polycrystalline layer induces stress on the semiconductor wafer, which acts to getter or remove the unwanted impurities during subsequent high temperature processing and to reduce the formation of impurity related defects. Unfortunately, during the subsequent high temperature process steps, the polycrystalline silicon layer itself recrystallizes, and thus loses a significant part of its gettering capability.

In addition, the polysilicon layer(s) can induce compressive stress on the semiconductor wafer, which can cause the semiconductor wafer to warp. This warpage issue can result in breakage and other quality issues particularly as the wafer diameter increases and/or the wafer thickness decreases.

A further problem associated with wafer processing involves the formation of semiconductor material aggregates referred to as silicon nodules. These defects grow on the lower surface of the wafers during, for example, the deposition of epitaxial layers. Typically, the nodules grow on the wafer when a low temperature oxide (LTO) is used as a backside sealing layer. The nodules are approximately spherical in shape, and can have diameters up to 40 microns. Defects of that size have caused wafer processing issues, including, for example, vacuum leak issues when the wafers are placed on vacuum support chucks. The vacuum leak issues can lead to misprocessed wafers, such as poorly transferred images in photolithography process steps.

Accordingly, an improved method and structure are needed that provide, among other things, gettering capability, reduced wafer warpage, and reduced formation of other defects, such as nodules. It would be further beneficial if such a method and structure were cost effective, were accomplished using existing equipment with minimal wafer transfers between equipment, and were to avoid added wafer clean steps.

BRIEF SUMMARY

The present description includes, among other features, a method of forming a semiconductor device having a multi-layer structure disposed on a major surface of a semiconductor substrate and the multi-layer structure. The multi-layer structure includes as-formed amorphous semiconductor layers and polycrystalline semiconductor layers disposed on the amorphous semiconductor layers. The amorphous semiconductor layers and the polycrystalline semiconductor layers are each separated by a non-conductive layer, such as a dielectric layer. In some examples, an outermost polycrystalline semiconductor layer is formed at a higher temperature than the other semiconductor layers. The multi-layer structure functions to reduce warpage of the semiconductor wafer, extrinsically getter the semiconductor wafer, and reduce the formation of the defects proximate to a back side surface of the semiconductor wafer. In one example, the multi-layer structure is formed in-situ in a single processing apparatus without exposing the semiconductor substrate to the outside of the processing apparatus until the multi-layer structure is formed.

More particularly, in one embodiment, a method of forming a semiconductor device includes providing a semiconductor substrate having a first major surface and an opposing second major surface. The method includes forming first semiconductor layers adjacent the second major surface, wherein the first semiconductor layers each comprise amorphous semiconductor material, and wherein forming the first semiconductor layers comprises forming first non-conductive layers interposed between each of the first semiconductor layers, and wherein the first semiconductor layers are each formed at a first temperature in a first temperature range. The method includes forming a second non-conductive layer adjacent an outermost one of the first semiconductor layers. The method includes forming second semiconductor layers adjacent the second non-conductive layer, wherein the second semiconductor layers each comprise polycrystalline semiconductor material, and wherein forming the second semiconductor layers comprises forming third non-conductive layers interposed between each of the second semiconductor layers, and wherein the second semiconductor layers are each formed at a second temperature in a second temperature range. The method includes forming a fourth non-conductive layer adjacent an outermost one of the second semiconductor layers. The method includes forming a third semiconductor layer adjacent the fourth non-conductive layer at a third temperature in a third temperature range, wherein the third semiconductor layer comprises polycrystalline semiconductor material, and wherein the third temperature range is higher than the first temperature range. The method includes forming a semiconductor device adjacent the first major surface.

In another embodiment, a method for forming a semiconductor device structure including the steps of a) providing a semiconductor substrate having a first major surface and an opposing second major surface; b) forming first semiconductor layers adjacent the second major surface, wherein the first semiconductor layers each comprise amorphous semiconductor material, and wherein forming the first semiconductor layers comprises forming first non-conductive layers interposed between each of the first semiconductor layers, and wherein the first semiconductor layers and the first non-conductive layers are each formed at a temperature in a first temperature range, wherein the first semiconductor layers each have an as-formed compressive stress; c) forming a second non-conductive layer adjacent an outermost one of the first semiconductor layers; d) forming second semiconductor layers adjacent the second non-conductive layer, wherein the second semiconductor layers each comprise polycrystalline semiconductor material, and wherein forming the second semiconductor layers comprises forming third non-conductive layers interposed between each of the second semiconductor layers, and wherein the second semiconductor layers and the third non-conductive layers are each formed at a temperature in a second temperature range; e) forming a fourth non-conductive layer adjacent an outermost one of the second semiconductor layers; f) forming a third semiconductor layer adjacent the fourth non-conductive layer at a temperature in a third temperature range, wherein the third semiconductor layer comprises polycrystalline semiconductor material, and wherein the third temperature range is higher than the first temperature range, and wherein the first semiconductor layers recrystallize during step f to provide the first semiconductor layers having tensile stress; and g) forming a semiconductor device structure adjacent the first major surface. In this example method, the first semiconductor layers are configured to compensate for stress induced by the second semiconductor layers on the semiconductor substrate to reduce warpage of the semiconductor substrate; the second semiconductor layers are configured to provide extrinsic gettering of the semiconductor substrate; and the third semiconductor layer is configured to reduce defect formation in the semiconductor substrate.

In a further embodiment, a method for forming a semiconductor device structure includes the steps of a) providing a semiconductor substrate having a first major surface and an opposing second major surface; b) forming first semiconductor layers adjacent the second major surface, wherein the first semiconductor layers each comprise amorphous semiconductor material, and wherein forming the first semiconductor layers comprises forming first non-conductive layers interposed between each of the first semiconductor layers, and wherein the first semiconductor layers and the first non-conductive layers are each formed at a temperature in a first temperature range, wherein the first semiconductor layers each have an as-formed compressive stress; c) forming a second non-conductive layer adjacent an outermost one of the first semiconductor layers; d) forming second semiconductor layers adjacent the second non-conductive layer, wherein the second semiconductor layers each comprise polycrystalline semiconductor material, and wherein forming the second semiconductor layers comprises forming third non-conductive layers interposed between each of the second semiconductor layers, and wherein the second semiconductor layers and the third non-conductive layers are each formed at a temperature in a second temperature range; e) forming a fourth non-conductive layer adjacent an outermost one of the second semiconductor layers; f) forming a third semiconductor layer adjacent the fourth non-conductive layer at a temperature in a third temperature range, wherein the third semiconductor layer comprises polycrystalline semiconductor material, and wherein the third temperature range is higher than the first temperature range, and wherein the first semiconductor layers recrystallize during step f to provide the first semiconductor layers having tensile stress; and g) forming a semiconductor device structure adjacent the first major surface. In the example method, steps b through f are carried out in a single deposition run; the first semiconductor layers are configured to compensate for stress induced by the second semiconductor layers on the semiconductor substrate to reduce warpage of the semiconductor substrate; the second semiconductor layers are configured to provide extrinsic gettering of the semiconductor substrate; and the third semiconductor layer is configured to reduce defect formation in the semiconductor substrate.

Other examples are included in the present disclosure. Such examples may be found in the figures, in the claims, and/or in the description of the present disclosure.

Figure 1:
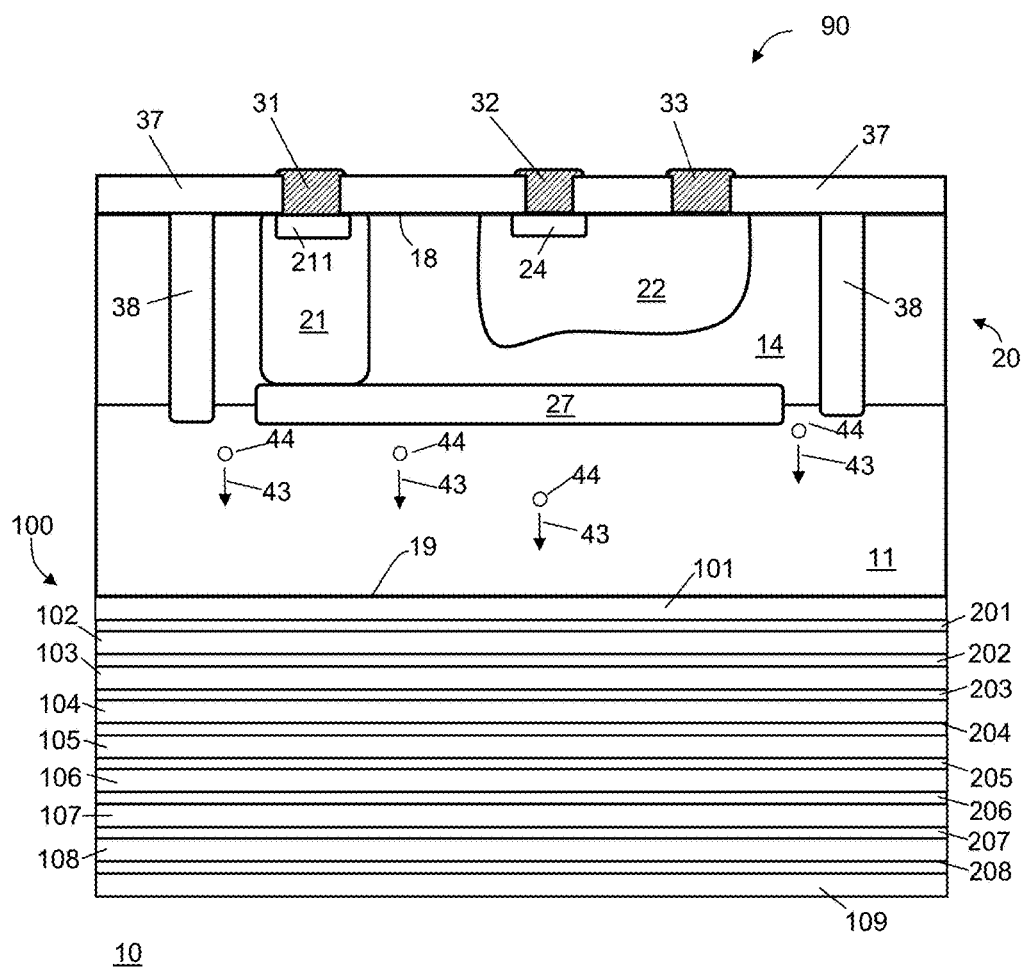
FIG. 1 illustrates an enlarged partial cross-sectional view of an example semiconductor device including a multi-layer structure.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF DRAWINGS

FIG. 1 illustrates an enlarged partial cross-sectional view of an example electronic device 10, such as a semiconductor device 10 at an intermediate step in fabrication formed as part of a semiconductor wafer 90 containing many such devices. In the example illustrated, device 10 can comprise an active device 20 or an active device portion 20, which can be formed in a semiconductor layer 14 provided as part of a semiconductor substrate 11. By way of example, semiconductor layer 14 can comprise a doped semiconductor layer, such as an n-type semiconductor layer, and can be formed using epitaxial growth techniques.

Active device 20 is illustrated as an NPN bipolar transistor device, and can further include an n-type collector region 21, a p-type base region 22, and an n-type emitter region 24. An n-type buried layer 27 can be formed adjacent semiconductor substrate 11 and semiconductor layer 14, and functions to reduce resistance between base region 22 and collector region 21. An n-type collector contact region 211 is formed within collector region 21, and functions to reduce contact resistance to a collector contact 31. An emitter contact 32 and a base contact 33 can be provided to contact emitter region 24 and base region 22 respectively adjacent a major surface 18 of semiconductor layer 14. A dielectric layer 37 can be formed overlying portions of major surface 18, and isolation regions 38 (e.g., p-type diffused isolation regions or trench isolation regions) can be formed in portions of semiconductor layer 14 to provide isolation for active device portion 20. It is understood that active device 20 is shown as an NPN transistor for illustrative purposes only, and that the structure and method described herein is suitable for many different kinds of devices including MOSFETs, IGFETs, diodes, thyristors, PNP bipolar devices, integrated circuits, sensor devices, optical devices, and other electronic devices known to those skilled in the art.

In addition, additional layers of dielectric material and additional layers of conductive interconnects can be provided overlying active device 20. Further, the structure and method described herein are suitable for processing discrete and/or integrated circuit devices, or are suitable to process blank (i.e., wafers yet to be front-end processed) semiconductor wafers. In general, the structure and method described herein are suitable for any device where impurity gettering and prevention of formation of impurity related defects is desired, where reducing substrate warpage is desired, and/or where reducing defects, such as nodule defects, is desired.

A multi-layer structure 100 is formed on or disposed overlying a lower, backside, or major surface 19 of semiconductor substrate 11. Multi-layer structure 100 is configured as a multi-purpose structure that provides gettering capability for device 10, that reduces substrate warpage of semiconductor substrate 11 and semiconductor layer 14, and that reduces the formation of defects within or on substrate 11 and/or semiconductor layer 14, such as nodule defects. In some embodiments, multi-layer structure 100 comprises semiconductor layers 101, 102, 103, 104, 105, 106, 107, 108, and 109 comprising one or more semiconductor materials. In addition, multi-layer structure 100 comprises non-conductive layers 201, 202, 203, 204, 205, 206, 207, and 208 comprising one or more non-conductive materials. In some embodiments, semiconductor layers 101-103 can comprise as-formed amorphous semiconductor layers and semiconductor layers 104-109 can comprise as-formed polycrystalline semiconductor layers. In some embodiments, non-conductive layers 201-208 can comprise dielectric materials, which can also be referred to as insulator materials or passivation materials.

Examples of methods for forming semiconductor layers 101-109 include chemical vapor deposition (CVD), plasma-enhanced CVD (PECVD), low-pressure CVD (LPCVD), physical vapor deposition (PVD), and atomic layer deposition (ALD) techniques. Examples of methods of forming non-conductive layers 201-208 include CVD, PECVD, thermal oxidation, low temperature oxidation (LTO), LPCVD, PVD, and ALD techniques.

In an example embodiment, semiconductor layers 101, 102, and 103 can comprise as-formed amorphous semiconductor layers, such as as-formed amorphous silicon layers. In most embodiments, the thickness of semiconductor layers 101, 102, and 103 can range from about 100 Angstroms to about 10,000 Angstroms. In some embodiments, the thickness of semiconductor layers 101, 102, and 103 can range from about 100 Angstroms to about 200 Angstroms. In an example embodiment, semiconductor layers 104, 105, 106, 107, 108, and 109 can comprise as-formed fine grain polycrystalline semiconductor layers, such as polysilicon layers. In most embodiments, the thickness of semiconductor layers 104, 105, 106, 107, 108, and 109 can range from about 100 Angstroms to about 10,000 Angstroms. In some embodiments, the thickness of semiconductor layers 104, 105, 106, 107, 108, and 109 can range from about 100 Angstroms to about 200 Angstroms. Although FIG. 1 illustrates semiconductor layers 101-109 having similar thicknesses, each or some of semiconductor layers 101-109 can have different thicknesses.

In an example embodiment, non-conductive layers 201, 202, 203, 204, 205, 206, 207, and 208 can comprise oxide layers, such as silicon oxide layers including silicon dioxide layers. In most embodiments, the thickness of non-conductive layers 201-206 can range from about 10 Angstroms to about 1000 Angstroms. In some embodiments, the thickness of non-conductive layers 201-206 can range from about 50 Angstroms to about 150 Angstroms. In most embodiments, the thickness of non-conductive layers 207 and 208 can range from about 10 Angstroms to about 10,000 Angstroms. In some embodiments, the thickness of non-conductive layer 207 can range from about 300 Angstroms to about 500 Angstroms, and the thickness of non-conductive layer 208 can range from about 700 Angstroms to about 950 Angstroms. In accordance with the present embodiment, some or all of non-conductive layers 201-209 are configured to improve thermal stability of multi-layer structure 100 and to improve backside sealing of semiconductor substrate 11 during subsequent processing, such as the processing steps used to form semiconductor layer 14.

In accordance with the present embodiment, semiconductor layers 101, 102, and 103, which comprise as-formed amorphous semiconductor material, are configured in multi-layer structure 100 to provide a reduction in the warpage of semiconductor substrate 11 and semiconductor layer 14. More particularly, semiconductor layers 101, 102, and 103 exhibit a tensile stress induced by volume contraction within these layers of porous material during subsequent crystallization. This tensile stress functions to compensate compressive stresses that are exhibited by semiconductor layers 104, 105, 106, 107, 108 and 109 when these layers comprise polycrystalline semiconductor material, such as polysilicon. In accordance with the present embodiment, the amount or degree of stress related compensation is a function of the thickness ratio of semiconductor layers 101-103 to semiconductor containing layers 104-109.

Figures 2, 3:
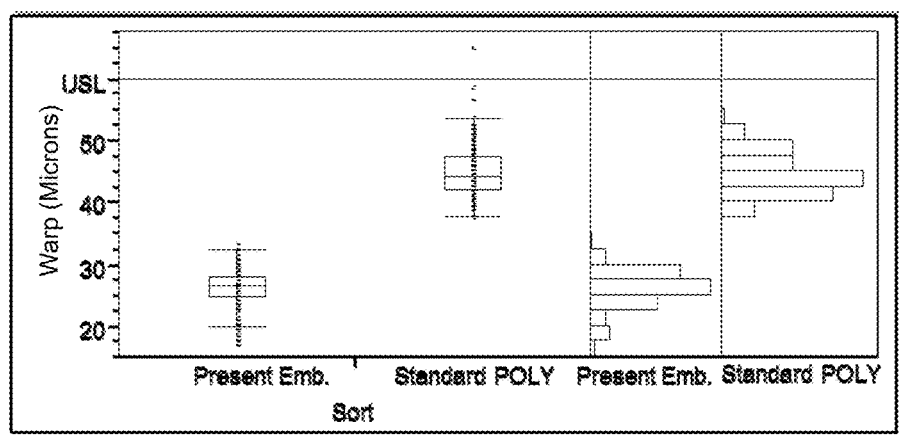
FIG. 2 is a graph showing warpage data for an example multi-layer structure compared to a prior structure.
FIG. 3 is a table of warpage distribution data for FIG. 2.

FIG. 2 is a graph of warpage data comparing the present embodiment having multi-layer structure 100 (labeled as "Present Emb.") to an embodiment that uses a polysilicon layer only (labeled as "Standard Poly"). FIG. 3 is a table of warpage distribution data used to prepare FIG. 2. As shown in FIGS. 2 and 3, the present embodiment including semiconductor layers 101, 102, and 103 significantly reduces the warpage distribution with a median value of 26.265 microns compared to 43.87 microns for the prior structure, which is approximately 40% reduction. In addition, multi-layer structure 100 provides a distribution well below the example upper specification limit ("USL") of 60 microns compared to the prior structure, which had results above the USL with a maximum of 64.955 microns.

In accordance with the present embodiment, semiconductor layers 104, 105, 106, 107, and 108, which comprise as-formed polycrystalline semiconductor material, such as polysilicon, are configured in multi-layer structure 100 to facilitate extrinsic gettering of semiconductor substrate 11 and semiconductor layer 14. Stated a different way, semiconductor layers 104-108 function to induce stress onto or within semiconductor substrate 11 and semiconductor layer 14 to getter (designated generally by arrows 43) unwanted impurities 44 including, but not limited to heavy metals, such as copper, nickel, and/or iron away from the active regions of active device portion 20. These metal impurities are a primary source of failure in active regions of semiconductor devices, which leads to overall failure of such devices. Such failures include, for example, high leakage currents as well as gate dielectric degradation in insulated gate type semiconductor devices.

The extrinsic gettering effect of semiconductor layers 104-108 is explained in part because the solubility of heavy metals in polycrystalline semiconductor material (e.g., polysilicon) at high temperature (e.g., greater than about 1000 degrees Celsius) is generally more than an order of magnitude higher than the solubility of the heavy metals in semiconductor substrate 11, which typically comprises single crystalline semiconductor material.

In addition, the gettering capability of multi-layer structure 100 is further provided by high density grain boundaries, twin boundary defects and other defects in semiconductor layers 104-108 having columnar-like structures. Also, interfaces between non-conductive layers 203-208, which in some embodiments can comprise buried silicon oxide layers, and respective semiconductor layers 104-108 are configured to contribute to the overall gettering capability of multi-layer structure 100. Further, non-conductive layers 203-208 function to reduce semiconductor material (e.g., silicon) self-interstitials diffusion at elevated temperature and hence, suppress re-crystallization of semiconductor layers 104-108. This helps to preserve the extrinsic gettering capability of multi-layer structure 100. In some preferred embodiments, the thickness of non-conductive layers 201-208 gradually increases in subsequent layers to provide improved passivation of semiconductor substrate 11 thereby protecting semiconductor substrate 11 from, among other things, auto-doping during subsequent processes, such as the formation of semiconductor layer 14. In some examples, the thickness of non-conductive layers 201-208 increases from about 90 Angstroms to about 600 Angstroms going from layer 201 to layer 208.

Figure 4:
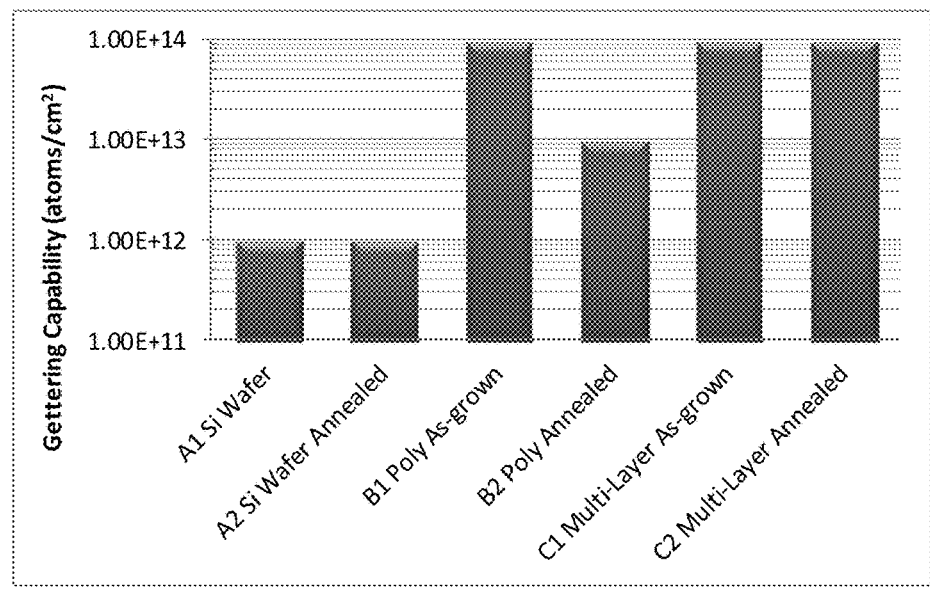
FIG. 4 is graph comparing the gettering capability of an example multi-layer structure to prior gettering structure and a semiconductor wafer without a gettering structure.

The gettering capability of multi-layer structure 100 is further shown in FIG. 4, which is a graph comparing the gettering capability in atoms/cm$^2$ of a silicon wafer without a an extrinsic gettering structure (denoted A1 and A2), a silicon wafer with a polysilicon layer (denoted B1 and B2), and a silicon wafer with multi-layer structure 100 (denoted C1 and C2). Designations A1, B1, and C1 correspond to each embodiment prior to a high temperature anneal process, and designations A2, B2, and C2 correspond to each embodiment after an anneal step of 1,100 degrees Celsius for approximately four (4) hours. A method of controlled contamination was used to analyze the gettering capability with evaluation by surface photo-voltage measurement of minority carrier diffusion length. As shown in FIG. 4, multi-layer structure 100 maintains its gettering capability to a much greater degree that embodiment B1/B2.

In most example embodiments, semiconductor layer 109 comprises a fine grained polysilicon. In accordance with the present embodiment, semiconductor layer 109 is configured to act as a seed layer to reduce the formation of large-sized nodules (e.g., nodules greater than about 15 microns in diameter) during, for example, processes used to form semiconductor layer 14. Such processes can include epitaxial growth processes. More particularly, the grain size of semiconductor material 109 is selected to be fine grained (e.g., typically less than 0.5 microns) so as to pre-set or pre-determine the reduced size of nodule defects formed, for example, during epitaxial growth processes. In prior structures and methods, the appearance of module defects greater than 15 microns is prevalent and such nodule defects result in lower process yields. For example, the presence of the nodule defects is known to present focusing issues during photolithographic steps.

Figure 5:
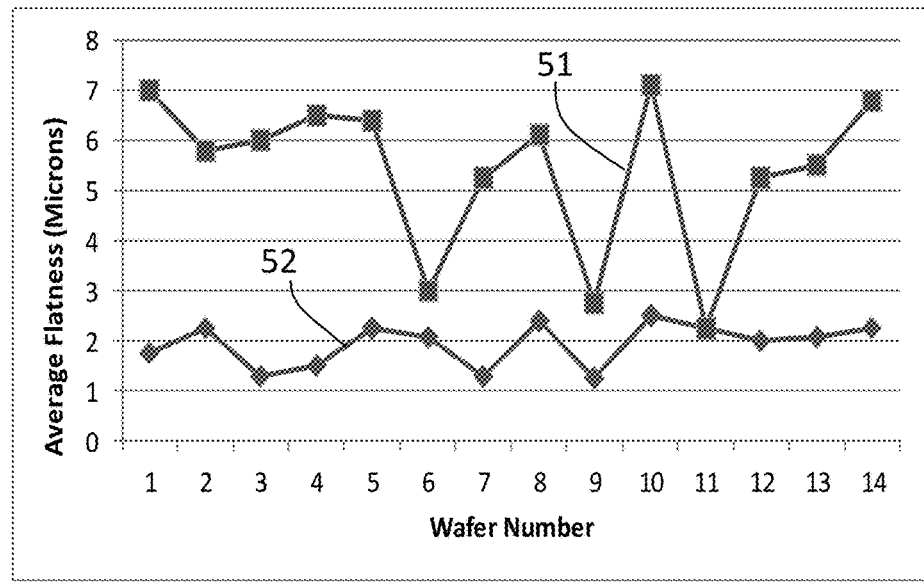
FIG. 5 is a graph showing flatness data for an example multi-layer structure compared to a prior structure.

FIG. 5 is a graph of wafer flatness data as measured on a commercially available stepper apparatus used in photolithographic processing of semiconductor wafers. Curve 51 is average flatness data in microns for multiple prior wafers without multi-layer structure 100, and curve 52 is average flatness data for wafers having multi-layer structure 100 including layer 109 configured as a fine grain polysilicon layer. Curve 51 shows the impact of large-sized nodules on wafer flatness, which can cause focusing issues during photolithographic processing. Curve 52 shows that multi-layer structure 100 improves the within wafer flatness values and also reduces wafer-to-wafer variability.

Turning now to FIGS. 6 to 13, a method for forming a semiconductor device 10 having multi-layer structure 100 adjacent to major surface of semiconductor substrate 11 now will be described. In the present description, semiconductor substrate 11 is illustrated in partial form so as to not distract from the description. It is understood that semiconductor substrate 11 can include a plurality of active devices adjacent to, for example, a major surface opposite to major surface 19 as illustrated, for example, in FIG. 1. It is understood that semiconductor substrate 11 can be a semiconductor wafer configured for manufacturing a plurality of semiconductor die that are subsequently separated into individual semiconductor devices. In accordance with the present embodiment, multi-layer structure 100 is formed in-situ or in a single process apparatus. Stated a different way, multi-layer structure 100 is formed in one cycle within a single process apparatus without removing semiconductor substrate 11 from the process apparatus for any intervening process steps, such as cleaning steps. This is a benefit compared to prior methods that require removing the semiconductor substrate from the process apparatus after the deposition of a polysilicon layer to clean the semiconductor substrate before forming an oxide layer in a separate process apparatus.

Figure 6:
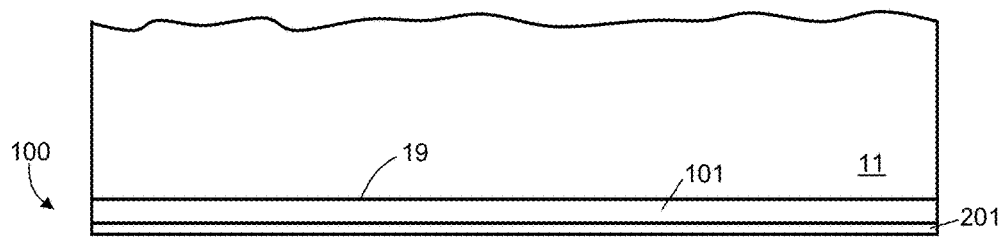
FIGS. 6-13 illustrate partial cross-sectional views of a semiconductor substrate at various stages of fabrication of an example multi-layer structure.

FIG. 6 illustrates a partial cross-sectional view of semiconductor substrate 11 at an early step in the fabrication of multi-layer structure 100. In some example embodiments, after semiconductor substrate 11 is cleaned, semiconductor substrate 11 is placed within a processing apparatus, such as CVD apparatus. The process starts at a temperature within the processing apparatus between about 550 degrees Celsius and about 590 degrees Celsius at a reduced pressure in a range from about 90 milliTorr (mTorr) to about 110 mTorr, which are process conditions to provide amorphous silicon growth to form semiconductor layer 101. A silicon source gas, such as silane, can be used to form semiconductor layer 101 (as well as semiconductor layers 102 and 103 described later). In the present embodiment, semiconductor layer 101 comprises an as-formed amorphous silicon layer, which has an as-formed compressive stress. In some examples, semiconductor layer 101 has a thickness in a range from about 100 Angstroms to about 200 Angstroms or more. In most embodiments, semiconductor layer 101 makes direct physical contact to semiconductor substrate 11 at major surface 19. In other embodiments, a temperature in range from about 565 degrees Celsius to about 575 degrees Celsius is used to form semiconductor layer 101 (as well as semiconductor layers 102 and 103 described later).

After semiconductor layer 101 is formed, the pressure in the processing apparatus is raised temporarily to about 300 mTorr to form non-conductive layer 201. In the present embodiment, non-conductive layer 201 comprises a silicon oxide layer and has a thickness in a range from about 10 Angstroms to about 1000 Angstroms. In some embodiments, non-conductive layer 201 has a thickness in a range from about 50 Angstroms to about 150 Angstroms. In some examples, a silicon source gas, such as silane and oxygen are used to form non-conductive layer 201 (as well as non-conductive layers 202-208 described later).

Figure 7:
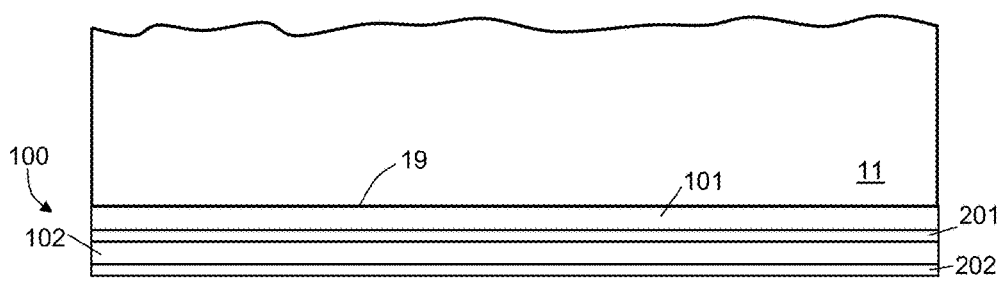

FIG. 7 illustrates a partial cross-sectional view of semiconductor substrate 11 after a further step in the fabrication of multi-layer structure 100. While semiconductor substrate 11 stills remains within the processing apparatus, pressure within the processing apparatus is then reduced to a pressure in a range from about 90 mTorr to about 110 mTorr with the temperature still in a range from about 550 degrees Celsius to about 590 degrees Celsius and semiconductor layer 102 is formed. In the present example, similar to semiconductor layer 101, semiconductor layer 102 comprises an as-formed amorphous silicon layer, which has an as-formed compressive stress. In some examples, semiconductor layer 102 has a thickness in a range from about 100 Angstroms to about 2000 Angstroms or more. After semiconductor layer 102 is formed, the pressure within the processing apparatus is raised temporarily to about 300 mTorr to form non-conductive layer 202. In the present embodiment, non-conductive layer 202 comprises a silicon oxide layer and has a thickness in a range from about 10 Angstroms to about 1000 Angstroms. In some embodiments, non-conductive layer 202 has a thickness in a range from about 50 Angstroms to about 150 Angstroms.

Figure 8:
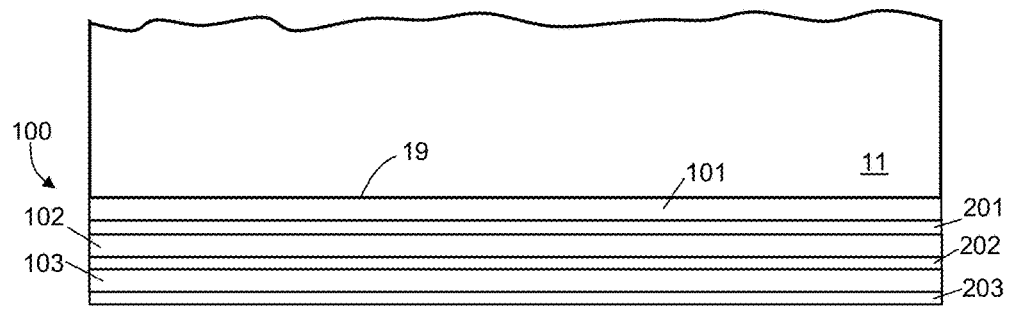

FIG. 8 illustrates a partial cross-sectional view of semiconductor substrate 11 at another step in the fabrication of multi-layer structure 100. While semiconductor substrate 11 still remains within the processing apparatus, pressure within the processing apparatus is then reduced to a pressure in a range from about 90 mTorr to about 110 mTorr with the temperature still in a range from about 550 degrees Celsius to about 590 degrees Celsius and semiconductor layer 103 is formed. In the present example, similar to semiconductor layers 101 and 102, layer 103 comprises an as-formed amorphous silicon layer, which has an as-formed compressive stress. In some examples, semiconductor layer 103 has a thickness in a range from about 100 Angstroms to about 2000 Angstroms or more. After semiconductor layer 103 is formed, the pressure within the processing apparatus is raised temporarily to about 300 mTorr to form non-conductive layer 203. In the present embodiment, non-conductive layer 203 comprises a silicon oxide layer and has a thickness in a range from about 10 Angstroms to about 1000 Angstroms. In some embodiments, non-conductive layer 203 has a thickness in a range from about 50 Angstroms to about 150 Angstroms. Later in the process of forming multi-layer structure 100, semiconductor layers 101, 102, and 103 are exposed to a temperature above 600 degrees Celsius, and these layers densify and exhibit a tensile stress. As stated previously, semiconductor layers 101, 102, and 103 are configured within multi-layer structure 100 to compensate for the compressive stresses exhibited by semiconductor layers 104-109 thereby reducing the warpage of semiconductor substrate 11. In some embodiments, the process described in the formation of semiconductor layer 101 and non-conductive layer 201 is repeated three (or more) times to form amorphous semiconductor layer 102, non-conductive layer 202, amorphous semiconductor layer 103, and non-conductive layer 203.

Figure 9:
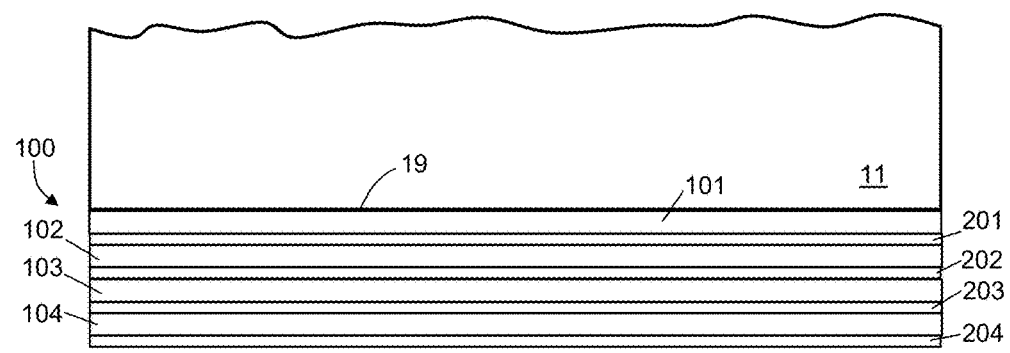

FIG. 9 illustrates a partial cross-sectional view of semiconductor substrate 11 after a further step in the fabrication of multi-layer structure 100. While semiconductor substrate 11 still remains within the processing apparatus, pressure within the processing apparatus is again reduced to a pressure in a range from about 90 mTorr to about 110 mTorr, but with the temperature within the processing apparatus increased to a temperature in a range from about 600 degrees Celsius to about 640 degrees Celsius to form semiconductor layer 104. In some embodiments, a temperature in a range from about 610 degrees Celsius to 620 degrees Celsius can be used. In accordance with the present embodiment, at this temperature range, semiconductor layer 104 comprises an as-formed fine grain polycrystalline semiconductor layer. In some examples, a silicon source gas, such as silane, is used to provide semiconductor layer 104 comprising an as-formed fine grain polysilicon layer. In some embodiments, semiconductor layer 104 has a thickness in a range from about 100 Angstroms to about 2000 Angstroms or more. After semiconductor layer 104 is formed, the pressure within the processing apparatus is raised temporarily to about 300 mTorr to form non-conductive layer 204. In the present embodiment, non-conductive layer 204 comprises a silicon oxide layer and has a thickness in a range from about 10 Angstroms to about 1000 Angstroms. In some embodiments, non-conductive layer 204 has a thickness in a range from about 50 Angstroms to about 150 Angstroms.

Figure 10:
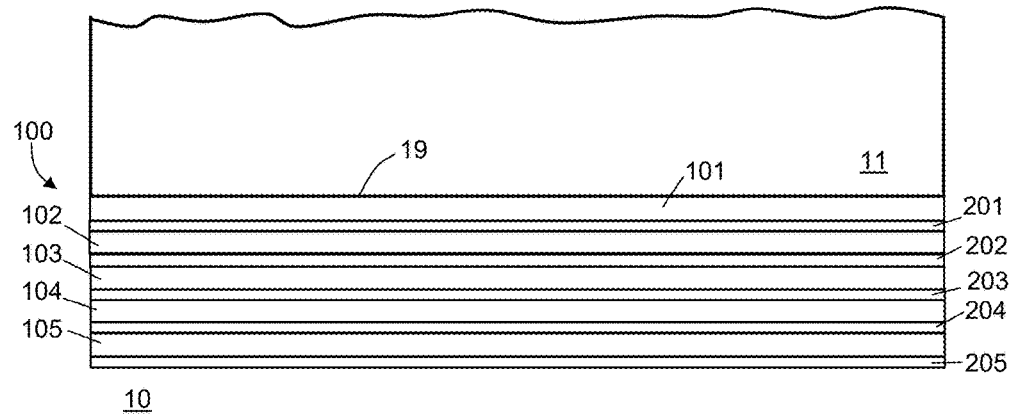
Figure 11:
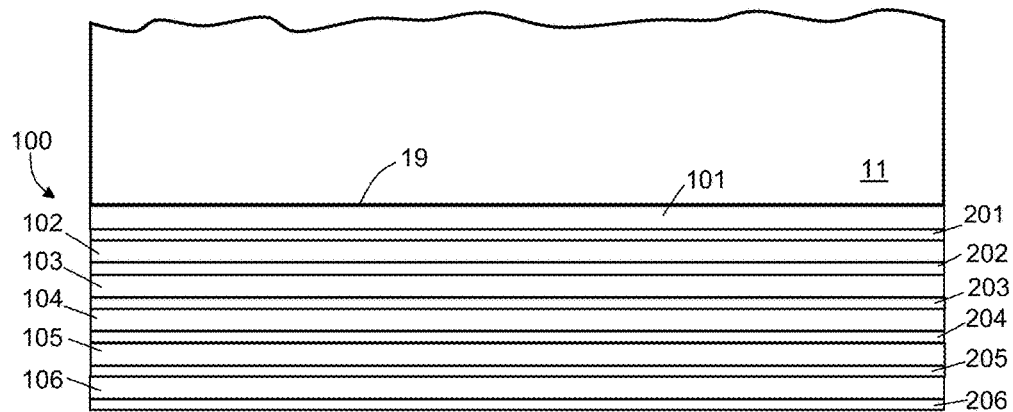
Figure 12:
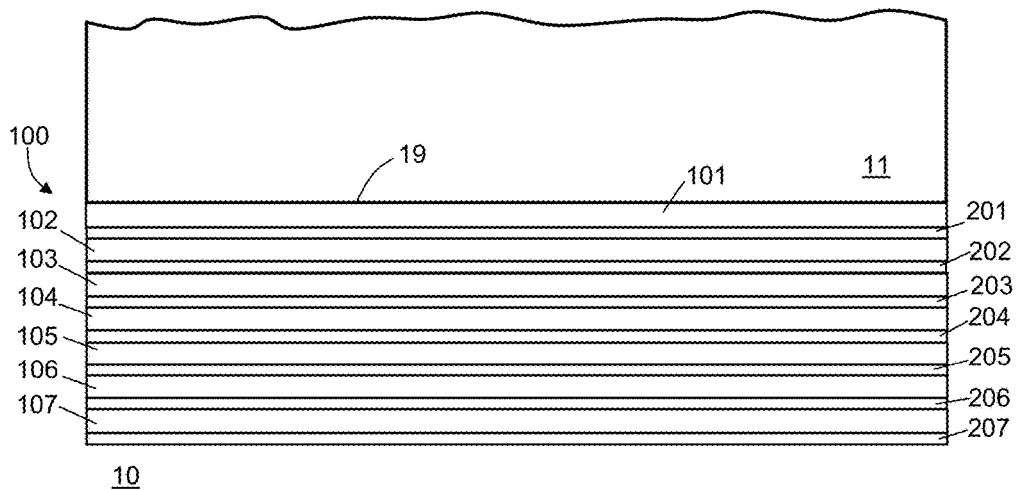

FIGS. 10, 11, and 12 illustrate partial cross-sectional views of semiconductor substrate 11 after additional steps in the fabrication of multi-layer structure 100. While substrate 11 still remains within the processing apparatus, in some example embodiments the process described in the formation of semiconductor layer 104 and non-conductive layer 204 is repeated three (or more) times to form semiconductor containing layer 105, non-conductive layer 205, semiconductor layer 106, non-conductive layer 206, semiconductor layer 107, and non-conductive layer 207. In some examples, a silicon source gas, such as silane is used with the pressure within the processing apparatus in a range from about 90 mTorr to about 110 mTorr and the temperature within the processing apparatus in a range from about 600 degrees Celsius to about 640 degrees Celsius to form semiconductor layers 105, 106 and 107 comprising as-formed fine grain polysilicon layers. In other embodiments, a temperature in a range from about 610 degrees Celsius to about 620 degrees Celsius can be used. In some embodiments, semiconductor layers 105, 106, and 107 have a thickness in a range from about 100 Angstroms to about 2000 Angstroms or more. In some examples, non-conductive layers 205, 206, and 207 comprise silicon oxide and have thicknesses in a range from about 10 Angstroms to about 10,000 Angstroms. In some embodiments, non-conductive layers 205, 206, and 207 have a thickness in a range from about 50 Angstroms to about 150 Angstroms.

Figure 13:
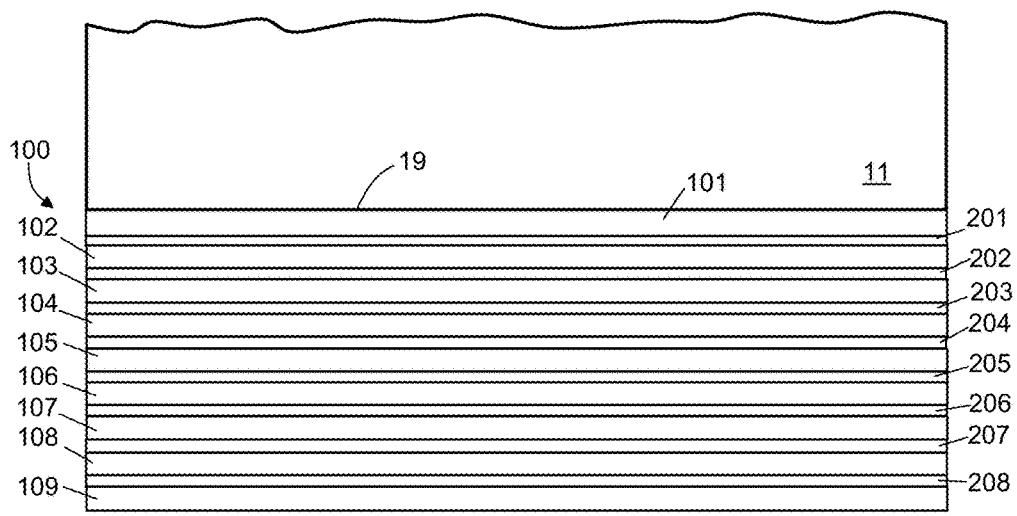

FIG. 13 illustrates a partial cross-sectional view of semiconductor substrate 11 after an additional step in the fabrication of multi-layer structure 100. While semiconductor substrate 11 still remains within the processing apparatus, pressure is then reduced after forming non-conductive layer 207 to a pressure within the processing apparatus in a range from about 90 mTorr to about 110 mTorr and the temperature within the processing apparatus is in a range from about 600 degrees Celsius to about 640 degrees Celsius to form semiconductor layer 108 comprising an as-formed fine grain polycrystalline semiconductor layer. In some examples, a silicon source gas, such as silane, is used to provide semiconductor layer 108 as an as-formed fine grain polysilicon layer. In some embodiments, semiconductor layer 108 has a thickness in a range from about 100 Angstroms to about 2000 Angstroms.

After layer 108 is formed and while semiconductor substrate 11 stills remains within the processing apparatus, temperature within the processing apparatus is increased to a temperature in a range from about 640 degrees Celsius to about 650 degrees Celsius and the last bilayer comprising non-conductive layer 208 and semiconductor layer 109 is formed in this temperature range. First, the pressure within the processing apparatus is raised temporarily to about 300 mTorr to form non-conductive layer 208. In the present embodiment, non-conductive layer 208 comprises a silicon oxide layer and has a thickness in a range from about 10 Angstroms to about 10,000 Angstroms. In some embodiments, non-conductive layer 208 has a thickness in a range from about 700 Angstroms to about 900 Angstroms.

While semiconductor substrate 11 still remains in the processing apparatus, pressure is again reduced to a pressure within the processing apparatus in range from about from about 90 mTorr to about 110 mTorr. In some examples, a silicon source gas, such as silane, is used to form semiconductor layer 109 as an as-formed fine grain polysilicon layer. In some embodiments, semiconductor layer 109 has a thickness in a range from about 100 Angstroms to about 2000 Angstroms. The elevated temperature provides semiconductor layer 109 as a fine grain polycrystalline layer, which is configured to function as a seed layer to reduce the formation of large-sized nodules during subsequent processing of semiconductor substrate 11. During this step and at this temperature, semiconductor layers 101, 102, and 103, which were as-formed amorphous silicon layers, crystalize resulting in polycrystalline structure comprising desired a tensile stress. In one preferred example, semiconductor substrate 11 remains in the processing apparatus after semiconductor layer 109 is formed at a temperature between about 640 degrees Celsius and about 650 degrees Celsius for an additional 15 minutes to 25 minutes to ensure semiconductor layers 101, 102, 103 sufficiently recrystallize.

In view of all of the above, it is evident that a novel multi-layer structure and method of providing structures has been disclosed that includes a plurality of amorphous layers disposed on a semiconductor substrate. The amorphous layers are separated by a dielectric layer and are configured to provide stress compensation. A plurality of fine grain polycrystalline semiconductor layers is disposed on the amorphous layers and are each separated by a dielectric layer and are configured to provide extrinsic gettering. A final fine grain polycrystalline semiconductor layer is disposed at an elevated temperature to provide a seed layer for reducing defects. The dielectric layers function to passivate the semiconductor substrate thereby reducing the effects of unwanted doping.

The multi-layer structure is configured to provide extrinsic gettering and backside sealing in one structure formed in a single deposition run. The multi-layer structure improves thermal stability of the gettering capability, compensates for excessive warpage by compensating residual stresses, and reduces the formation of defects, such as epitaxial backside nodules. In addition, the multi-layer structure eliminates the need for a separately formed low-temperature oxide ("LTO") passivation as used in prior methods, which eliminates the need for edge stripping the LTO passivation. Since the method described takes place within the same processing apparatus, the method provides a cost reduction over previous methods by eliminating separate cleaning and deposition steps, and by reducing scrap caused by edge stripping defects and backside nodule defects. The method further improves productivity by process flow simplification.

While the subject matter has been described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method of forming a semiconductor device comprising:
   providing a semiconductor substrate having a first major surface and an opposing second major surface;
   forming first semiconductor layers adjacent the second major surface, wherein the first semiconductor layers each comprise an amorphous semiconductor material, and wherein forming the first semiconductor layers comprises forming first non-conductive layers interposed between each of the first semiconductor layers, and wherein the first semiconductor layers are each formed at a first temperature in a first temperature range;
   forming a second non-conductive layer adjacent an outermost one of the first semiconductor layers;
   forming second semiconductor layers adjacent the second non-conductive layer, wherein the second semiconductor layers each comprise a polycrystalline semiconductor material, and wherein forming the second semiconductor layers comprises forming third non-conductive layers interposed between each of the second semiconductor layers, and wherein the second semiconductor layers are each formed at a second temperature in a second temperature range;
   forming a fourth non-conductive layer adjacent an outermost one of the second semiconductor layers;
   forming a third semiconductor layer adjacent the fourth non-conductive layer at a third temperature in a third temperature range, wherein the third semiconductor layer comprises a polycrystalline semiconductor material, and wherein the third temperature range is higher than the first temperature range; and
   forming a semiconductor device adjacent the first major surface.

2. The method of claim 1, wherein forming the first semiconductor layers comprises forming amorphous silicon layers.

3. The method of claim 2, wherein forming the amorphous silicon layers comprises forming first dielectric layers interposed between each of the amorphous silicon layers.

4. The method of claim 3, wherein forming the first dielectric layers comprises forming oxide layers each having a thickness in a range from about 10 Angstroms to about 1000 Angstroms.

5. The method of claim 2, wherein the first temperature range is from about 550 degrees Celsius through about 590 degrees Celsius.

6. The method of claim 5, wherein forming the amorphous silicon layers comprises forming the amorphous silicon layers each having a thickness in a range from about 10 Angstroms through about 10,000 Angstroms.

7. The method of claim 1, wherein forming the second non-conductive layer comprises forming an oxide layer.

8. The method of claim 1, wherein forming the second semiconductor layers comprises forming polysilicon layers.

9. The method of claim 8, wherein forming the second semiconductor layers comprises forming second dielectric layers interposed between each of the polysilicon layers.

10. The method of claim 9, wherein forming the second dielectric layers comprises forming oxide layers each having a thickness in a range from about 10 Angstroms to about 1000 Angstroms.

11. The method of claim 8, wherein the second temperature range is from about 600 degrees Celsius through about 640 degrees Celsius.

12. The method of claim 8, wherein forming the polysilicon layers comprises forming the polysilicon layers each having a thickness in range from about 10 Angstroms through about 1000 Angstroms.

13. The method of claim 1, wherein forming the third semiconductor layer comprises forming a polycrystalline semiconductor layer.

14. The method of claim 13, wherein forming the polycrystalline semiconductor layer comprises forming a polysilicon layer, wherein the third temperature range is from about 640 degrees Celsius through about 650 degrees Celsius.

15. The method of claim 14, wherein forming the fourth non-conductive layer comprises forming an oxide layer at a fourth temperature in the third temperature range.

16. The method of claim 14, wherein forming the polysilicon layer comprises forming the polysilicon layer having a thickness in a range from about 1000 Angstroms through about 2000 Angstroms.

17. The method of claim 1, wherein the steps of forming the first semiconductor layers, forming the second non-conductive layer, forming the second semiconductor layers, forming the fourth non-conductive layer, and forming the third semiconductor layer are carried out in a single processing apparatus without exposing the semiconductor substrate outside of the processing apparatus until after the third semiconductor layer is formed.

18. A method for forming a semiconductor device structure comprising the steps of:
   a. providing a semiconductor substrate having a first major surface and an opposing second major surface;
   b. forming first semiconductor layers adjacent the second major surface, wherein the first semiconductor layers each comprise an amorphous semiconductor material, and wherein forming the first semiconductor layers comprises forming first non-conductive layers interposed between each of the first semiconductor layers, and wherein the first semiconductor layers and the first non-conductive layers are each formed at a temperature in a first temperature range, wherein the first semiconductor layers each have an as-formed compressive stress;
   c. forming a second non-conductive layer adjacent an outermost one of the first semiconductor layers;
   d. forming second semiconductor layers adjacent the second non-conductive layer, wherein the second semiconductor layers each comprise a polycrystalline semiconductor material, and wherein forming the second semiconductor layers comprises forming third non-conductive layers interposed between each of the second semiconductor layers, and wherein the second semiconductor layers and the third non-conductive layers are each formed at a temperature in a second temperature range;

e. forming a fourth non-conductive layer adjacent an outermost one of the second semiconductor layers;

f. forming a third semiconductor layer adjacent the fourth non-conductive layer at a temperature in a third temperature range, wherein the third semiconductor layer comprises a polycrystalline semiconductor material, and wherein the third temperature range is higher than the first temperature range, and wherein the first semiconductor layers recrystallize during step f to provide the first semiconductor layers having tensile stress; and g. forming a semiconductor device structure adjacent the first major surface, wherein:

the first semiconductor layers are configured to compensate for stress induced by the second semiconductor layers on the semiconductor substrate to reduce warpage of the semiconductor substrate;

the second semiconductor layers are configured to provide extrinsic gettering of the semiconductor substrate; and the third semiconductor layer is configured to reduce defect formation in the semiconductor substrate.

19. The method of claim 18, wherein:

steps b through f are carried out in a single deposition run;

forming the first semiconductor layers comprises forming amorphous silicon layers where the first temperature range is from about 550 degrees Celsius through about 590 degrees Celsius;

forming the first non-conductive layers comprises forming oxide layers;

forming the second semiconductor layer comprises forming polysilicon layers where the second temperature range is from about 600 degrees Celsius through about 640 degrees Celsius;

forming the second non-conductive layers comprises forming oxide layers;

forming the fourth non-conductive layer comprises forming an oxide layer in the third temperature range; and forming the third semiconductor layer comprises forming another polysilicon layer where the third temperature range is from about 640 degrees Celsius through about 650 degrees Celsius.

20. A method for forming a semiconductor device structure comprising the steps of:

a. providing a semiconductor substrate having a first major surface and an opposing second major surface;

b. forming first semiconductor layers adjacent the second major surface, wherein the first semiconductor layers each comprise an amorphous semiconductor material, and wherein forming the first semiconductor layers comprises forming first non-conductive layers interposed between each of the first semiconductor layers, and wherein the first semiconductor layers and the first non-conductive layers are each formed at a temperature in a first temperature range, wherein the first semiconductor layers each have an as-formed compressive stress;

c. forming a second non-conductive layer adjacent an outermost one of the first semiconductor layers;

d. forming second semiconductor layers adjacent the second non-conductive layer, wherein the second semiconductor layers each comprise a polycrystalline semiconductor material, and wherein forming the second semiconductor layers comprises forming third non-conductive layers interposed between each of the second semiconductor layers, and wherein the second semiconductor layers and the third non-conductive layers are each formed at a temperature in a second temperature range;

e. forming a fourth non-conductive layer adjacent an outermost one of the second semiconductor layers;

f. forming a third semiconductor layer adjacent the fourth non-conductive layer at a temperature in a third temperature range, wherein the third semiconductor layer comprises a polycrystalline semiconductor material, and wherein the third temperature range is higher than the first temperature range, and wherein the first semiconductor layers recrystallize during step f to provide the first semiconductor layers having tensile stress; and g. forming a semiconductor device structure adjacent the first major surface, wherein:

steps b through f are carried out in a single deposition run;

the first semiconductor layers are configured to compensate for stress induced by the second semiconductor layers on the semiconductor substrate to reduce warpage of the semiconductor substrate;

the second semiconductor layers are configured to provide extrinsic gettering of the semiconductor substrate; and the third semiconductor layer is configured to reduce defect formation in the semiconductor substrate.

* * * * *